US007030705B2

(12) United States Patent
Kim

(10) Patent No.: US 7,030,705 B2
(45) Date of Patent: Apr. 18, 2006

(54) SECTION SELECTION LOOP FILTER AND PHASE LOCKED LOOP CIRCUIT HAVING THE SAME

(75) Inventor: Jae-Wan Kim, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 19 days.

(21) Appl. No.: 10/840,491

(22) Filed: May 6, 2004

(65) Prior Publication Data

US 2004/0232999 A1 Nov. 25, 2004

(30) Foreign Application Priority Data

May 20, 2003 (KR) ..................... 10-2003-0032058

(51) Int. Cl.
*H03L 7/00* (2006.01)

(52) U.S. Cl. ........................................ 331/16; 327/147

(58) Field of Classification Search ................ 327/147, 327/146, 154, 155, 162, 163; 331/16, 17, 331/1 A, 25, DIG. 2; 375/373, 375, 376
See application file for complete search history.

(56) References Cited

U.S. PATENT DOCUMENTS 5,107,220 A * 4/1992 Andoh ........................ 327/41
6,819,197 B1 * 11/2004 Maldonado ................ 333/17.1

FOREIGN PATENT DOCUMENTS

JP 2002-368612 12/2002

* cited by examiner

*Primary Examiner*—Linh My Nguyen
(74) *Attorney, Agent, or Firm*—F. Chau & Associates, LLC

(57) ABSTRACT

A section selection loop filter for use in a phase lock loop for reducing sizes of hardware and increase ranges of tuning, including a selection signal outputting part for setting a first to fourth sections according to an input tuning voltage, selecting a first to fourth selection signals corresponding to the first to fourth sensing sections respectively, and outputting the first to fourth selection signals to a filtering part, and a filtering part for receiving and filtering a charge-pumping signal from a charge pump based on the four selection signals for the four sensing sections.

23 Claims, 10 Drawing Sheets

| S | R | Q | $Q_B$ |
|---|---|---|---|
| 1 | 1 | Q | $Q_B$ |
| 0 | 1 | 1 | 0 |
| 1 | 0 | 0 | 1 |
| 0 | 0 | 1 | 1 |

SECTION SELECTION LOOP FILTER AND PHASE LOCKED LOOP CIRCUIT HAVING THE SAME

CROSS-REFERENCE TO RELATED APPLICATION

This application claims priority to Korean Patent Application No. 2003-32058, filed on May 20, 2003, the contents of which are incorporated herein by reference.

BACKGROUND OF THE INVENTION

1. Field of the Invention

The present invention relates to a section selecting loop filter and a phase locked loop circuit having the same.

2. Description of the Related Art

A phase locked loop (hereinafter, referred to as "PLL") circuit synchronizes the phase of a local signal with a reference signal. Generally, the local signal is used in a clock recovery circuit of a digital communication system, a frequency synthesizer, and as a clock generator of a microprocessor and a modulation-demodulation circuit, etc.

FIG. 1 is a block diagram illustrating the architecture of a general phase locked loop circuit.

As shown in FIG. 1, the PLL circuit generally includes a phase detector 100, a charge pump 110, a loop filter 120 and a voltage controlled oscillator 130.

The phase detector 100 detects the difference in phase between a reference signal and a local signal provided from the voltage controlled oscillator 130, and outputs a pulse signal in accordance with the result of the detection. The charge pump 110 outputs a current in accordance with the pulse signal provided from the phase detector 100. The loop filter 120 outputs a tuning signal having a tuning voltage in accordance with the current provided from the charge pump 110 to the voltage controlled oscillator 130. The voltage controlled oscillator 130 outputs the local signal in accordance with the tuning signal provided from the loop filter 120.

The loop filter 120 generates the tuning signal in accordance with the current provided from the charge pump 110. In addition, the loop filter 120 filters noise from the current provided from the charge pump 110 to remove a noise.

The conventional loop filter 120 includes two MiM (metal insulator metals) capacitors (C1, C2) and a resistor (R1) as shown in FIG. 2.

The loop filter mentioned above is typically disposed in an integrated circuit. The loop filter includes a capacitor and the capacitor that occupies a small area per unit capacitance is needed to reduce the overall size of the loop filter. However, it is difficult to reduce the area occupied by the capacitor1 in the loop filter because the MiM capacitors generally used in CMOS processes have low capacitance per unit capacitor.

A MiM capacitor forms one of the two electric nodes between one metal and another metal to increase the capacitance, and an extra mask is required.

Alternatively, a MOS capacitor instead of a CMOS capacitor can be used. A MOS capacitor has high capacitance and does not require an extra mask. For example, while capacitance per unit area of the MiM capacitor used in 0.18 μm CMOS process is 1 $\mu F/\mu m^2$, capacitance per unit area of the MOS capacitor is 8 $\mu F/\mu m^2$.

FIG. 3A shows a conventional loop filter using a NMOS capacitor, and FIG. 3B shows another conventional loop filter using a PMOS capacitor.

As shown in FIG. 3A, the loop filter includes a first NMOS capacitor (NMC1) and a second NMOS capacitor (NMC2) coupled in parallel and a resistor (R2) coupled in series to the first NMOS capacitor (NMC1). The first NMOS capacitor (NMC1) and the second NMOS capacitor (NMC2) are operated only when the voltage of a gate of the NMOS is above the threshold voltage ($V_{TN}$) of the NMOS capacitor.

As shown in FIG. 3B, the loop filter includes a first PMOS capacitor (PMC1) and a second PMOS capacitor (PMC2) coupled in parallel and a resistor (R3) coupled in series to the first PMOS capacitor (PMC1). Here, the first PMOS capacitor (PMC1) and the second PMOS capacitor (PMC2) are operated only when the voltage of a gate of the PMOS is at voltages below a bias voltage ($V_{dd}$) minus a threshold voltage ($V_{TP}$) of the PMOS capacitor.

The loop filter as shown above includes a NMOS capacitor and a PMOS capacitor.

In the case of a loop filter including a NMOS capacitor, the loop filter is not operated when the voltage of the gate is not more than the threshold voltage ($V_{TN}$) of the NMOS capacitor. Whereas in the case of a loop filter including a PMOS capacitor, the loop filter is not operated when the voltage of the gate is above a voltage that equals to the bias voltage ( $V_{dd}$) minus the threshold voltage ($V_{TP}$) of the PMOS capacitor.

Therefore, a PLL used by the conventional loop filters has limited tuning range because the filters cannot output a precise or fine tuning voltage for controlling the local signal of the voltage controlled oscillator. A need therefore exists for a selection loop filter that occupies a small area and operates in the whole range of an electric source voltage.

SUMMARY OF THE INVENTION

A section selection loop filter according to an embodiment of the invention comprises a selection signal outputting part, a first filtering part, and a second filtering part. A selection signal outputting part outputs respectively first to fourth selection signals corresponding to first to fourth sensing sections in accordance with a tuning voltage corresponding to an input voltage thereof. A first filtering part receives a charge-pumping signal, generating a first tuning signal and a second tuning signal having a first logic using the received charge-pumping signal, the first selection signal, and the second selection signal. A second filtering part receives the charge-pumping signal, generating a third tuning signal and a fourth tuning signal having a second logic using the received charge-pumping signal, the third selection signal, and the fourth selection signal, wherein the second logic is opposed to the first logic.

A phase locked loop circuit according to another embodiment of the invention comprises a voltage controlled oscillator, a phase detector, a loop filter selector, a loop filter. A voltage controlled oscillator outputs a frequency signal in accordance with a tuning voltage corresponding to an input voltage thereof. A phase detector generates a pulse signal in accordance with the difference of the frequency signal and a reference signal in view of phase. A loop filter selector sets a first sensing section, a second sensing section, a third sensing section and a fourth sensing section in accordance with the tuning voltage, and outputting a first to a fourth selection signals in accordance with the first to fourth sensing sections. A loop filter outputs first to fourth tuning signals in accordance with the first to fourth selection signals using the pulse signal to the voltage controlled oscillator.

An output full swing type low pass filter according to another embodiment of the invention comprises a resistor, a PMOS capacitor, a NMOS capacitor, a first switching means, a second switching means, and a selection means. A resistor is coupled between an input terminal and an output terminal. A PMOS capacitor is coupled between a first electric source voltage and the output terminal. A NMOS capacitor is coupled between a second electric source voltage and the output terminal. A first switching means is coupled to the PMOS capacitor. A second switching means is coupled to the NMOS capacitor. A selection means turns on the second switching means in a first sensing section and turns on the first switching means in a second sensing section, thereby coupling selectively the PMOS capacitor and the NMOS capacitor, wherein a voltage of the output terminal corresponding to the first sensing section is in the range of the second electric source voltage to a first transition point voltage and the voltage of the output terminal corresponding to the second sensing section is in the range of the first electric source voltage to a second transition point voltage in view of level.

As described above, the loop filter according to an embodiment of the invention includes the NMOS capacitor and the PMOS capacitor. The loop filter selector generates selection signals for operating selectively the NMOS capacitor and the PMOS capacitor in accordance with the tuning voltage.

The loop filter selector operates selectively the PMOS capacitor and the NMOS capacitor in accordance with a range of the tuning voltage. Thus, the loop filter is operated in the range of 0 to the electric source voltage. As a result, a tuning range of the phase locked loop circuit is increased up to the electric source voltage, and is about 33% increase compared to a conventional tuning range when the electric source voltage of 0.18 μm CMOS process is 1.8V.

Since the unit capacitance of a MOS capacitor is higher than that of a MiM capacitor, the area occupying a loop filter is thus reduced.

In addition, since an extra mask for increasing the capacitance of the capacitor when MiM capacitor is used in CMOS process is no longer required, the cost of manufacturing a capacitor is reduced.

BRIEF DESCRIPTION OF THE DRAWINGS

The above features of the present invention will become more apparent by reference to the following detailed description when considered in conjunction with the accompanying drawings in which.

DESCRIPTION OF THE PREFERRED EMBODIMENTS

Hereinafter, the embodiments of the invention will be explained in more details with reference to the accompanying drawings.

Figure 1:
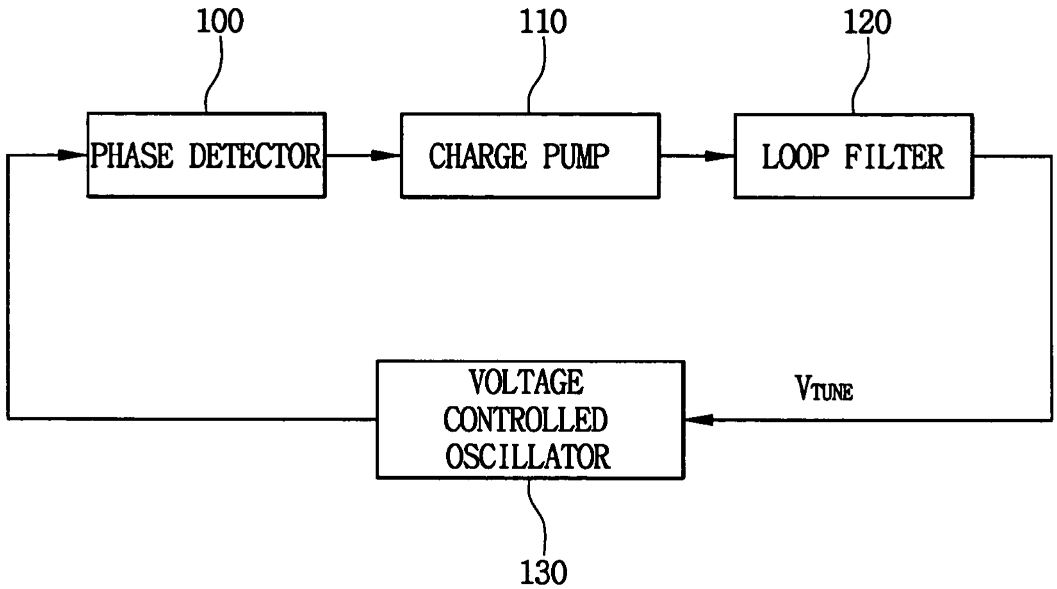
FIG. 1 is a block diagram illustrating the architecture of a conventional phase locked loop circuit.
Figure 2:
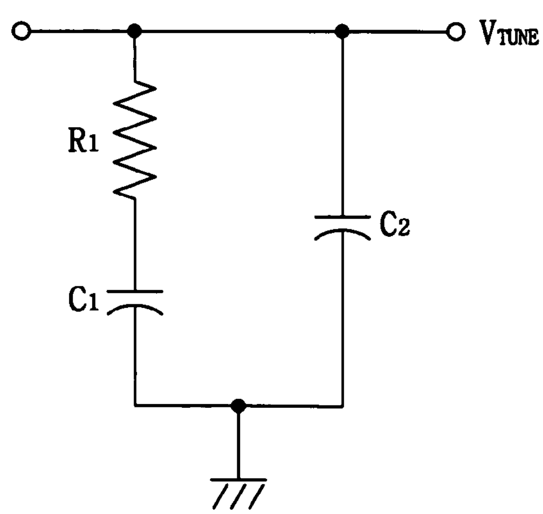
FIG. 2 is a circuit of a loop filter of FIG. 1.
Figure 3A:
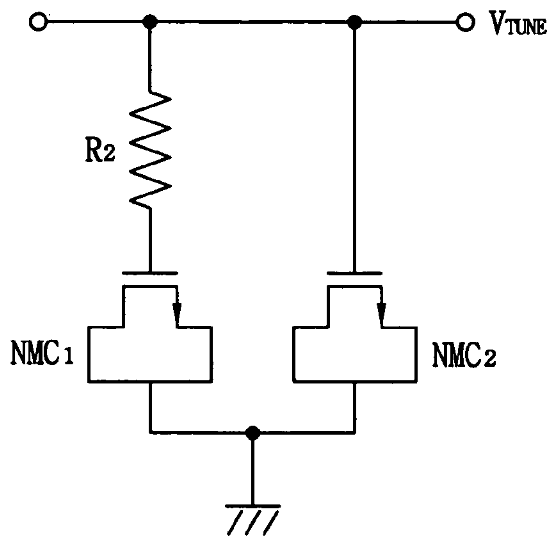
FIG. 3A shows a conventional loop filter using a NMOS capacitor.
Figure 3B:
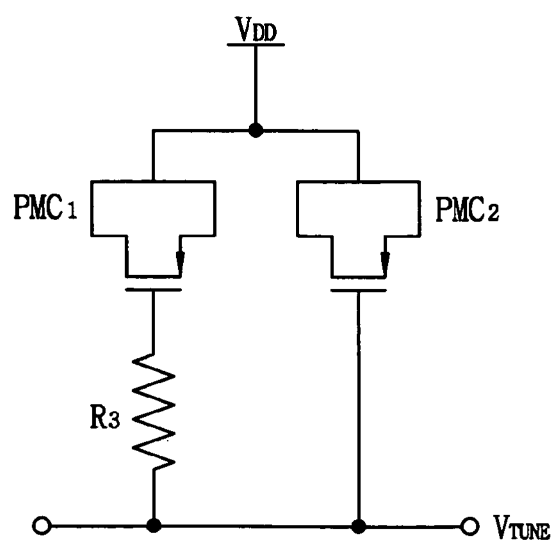
FIG. 3B shows a conventional loop filter using a PMOS capacitor.
Figure 4:
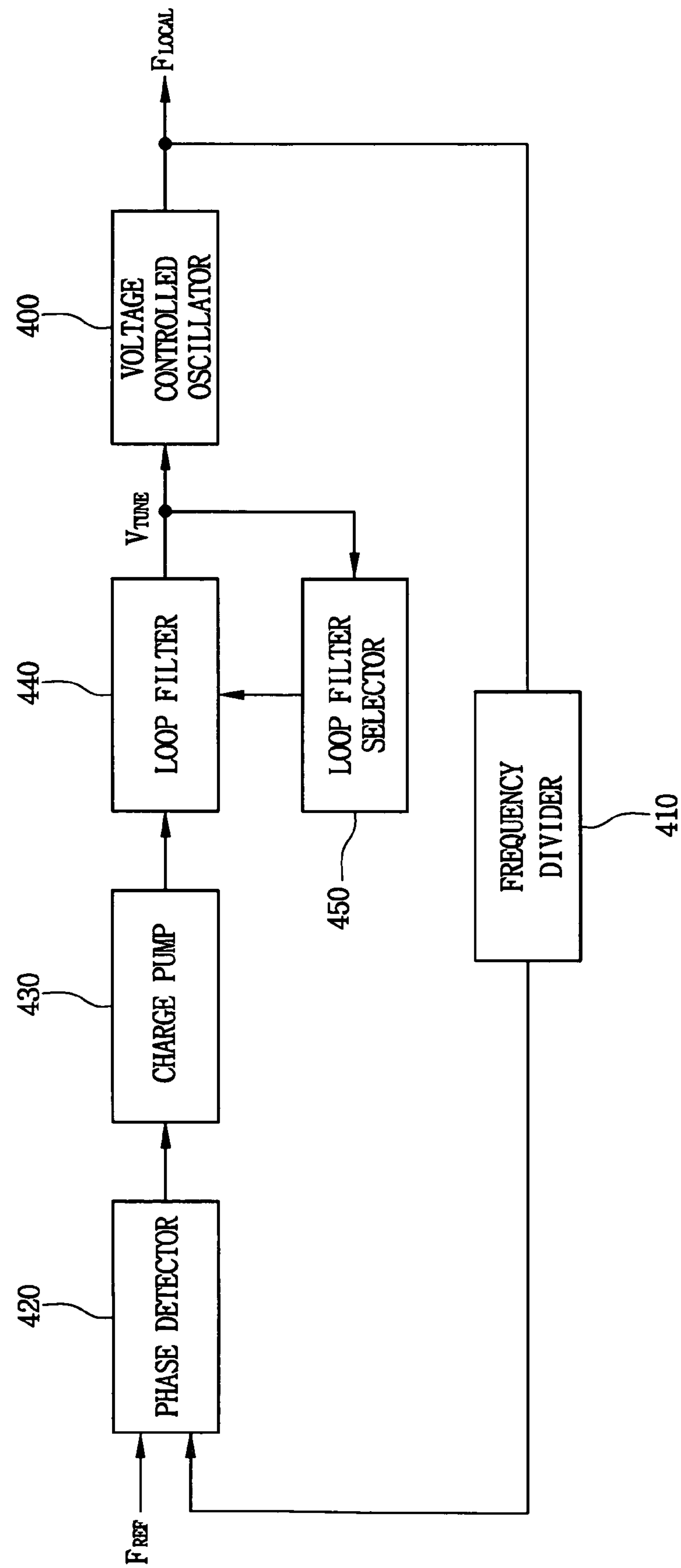
FIG. 4 is a block diagram illustrating the architecture of a phase locked loop circuit according to an embodiment of the invention.
Figure 5:
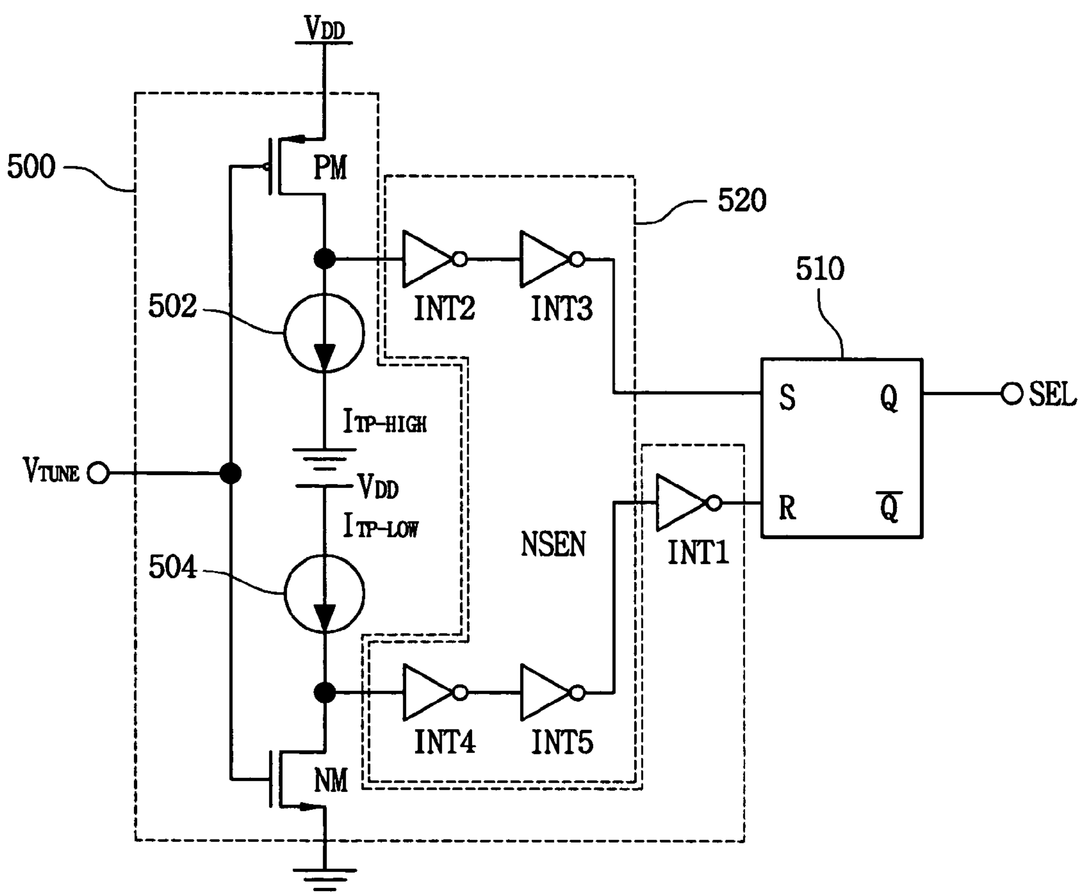
FIG. 5 shows a loop filter selector of FIG. 4.
Figure 6:
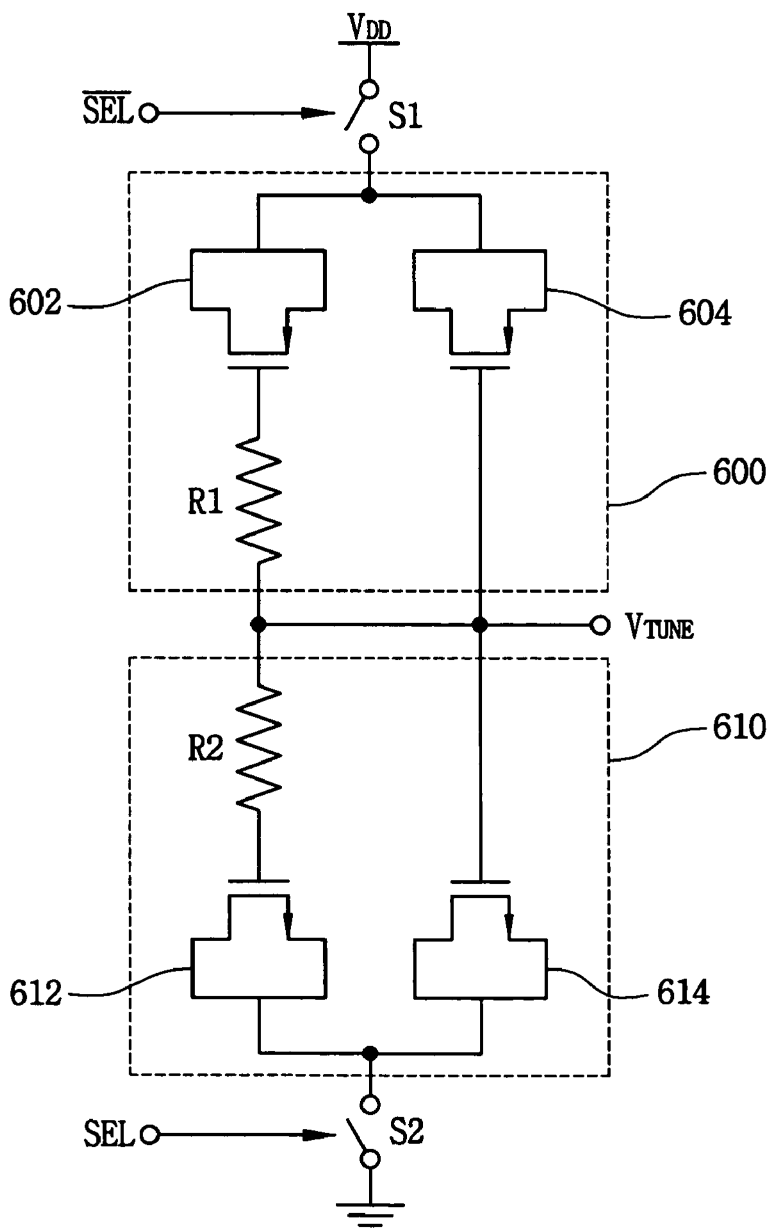
FIG. 6 shows a loop filter of FIG. 4.

FIG. 4 is a block diagram illustrating the architecture of a phase locked loop circuit according to an embodiment of the invention, FIG. 5 shows a circuit of a loop filter selector of FIG. 4, and FIG. 6 shows a circuit of the loop filter of FIG. 4.

As shown in FIG. 4, the phase locked loop (hereinafter, referred to as "PLL") circuit according to an embodiment of the invention includes a voltage controlled oscillator (hereinafter, referred to as "VCO") 400, a frequency divider 410, a phase detector 420, a charge pump 430, a loop filter 440, and a loop filter selector 450.

The VCO 400 outputs a local signal ($f_{local}$) having a specific frequency in accordance with a tuning voltage ($V_{tune}$). The frequency divider 410 divides the local signal ($f_{local}$) outputted from the VCO 400 with constant rate (N) in view of frequency. The frequency divider 410 divides the local signal ($f_{local}$) having a high frequency outputted from the VCO 400 into a local signal having a low frequency.

The phase detector 420 compares a reference signal ($f_{ref}$) with the local signal ($f_{local}$) divided from the frequency divider 410, and outputs a pulse signal corresponding to the difference between the phase of the divided local signal and the reference signal.

The charge pump 430 outputs current in accordance with the pulse signal outputted from the phase detector 420. The loop filter selector 450 outputs selection signals having either high logic or low logic to the loop filter 440 in accordance with the tuning voltage ($V_{tune}$).

The loop filter 440 operates in accordance with the selection signals outputted from the loop filter selector 450, charges electric charge capacity in accordance with the current outputted from the charge pump 430, and outputs the tuning voltage ($V_{tune}$) in accordance with the charged electric charge capacity to the VCO 400. The tuning voltage ($V_{tune}$) controls the local signal ($f_{local}$) outputted from the VCO 400. The loop filter 440 outputs the tuning voltage ($V_{tune}$) in accordance with the current outputted from the charge pump 430. In addition, the loop filter 440 filters the current to remove a noise included in the current outputted from the charge pump 430.

Detailed description of the loop filter selector 450 and the loop filter 440 is as follows.

As shown in FIG. 5, the loop filter selector 450 includes an inverter type comparator 500 for receiving the tuning voltage ($V_{tune}$) and setting a first sensing section to a fourth sensing section (A, B, C, D), an SR flip flop 510 for outputting a first selection signal to a fourth selection signal in accordance with the first to fourth sensing sections, and an inverting part 520 for promptly changing the signal in the sensing sections.

The inverter type comparator 500 includes a PMOS transistor (hereinafter, referred to as "PM") and a NMOS transistor (hereinafter, referred to as "NM) operated in accordance with the tuning voltage ($V_{tune}$), a first electric source 502 coupled to the drain terminal of the PMOS transistor, a second electric source 504 coupled to the drain terminal of the NMOS transistor, and a first inverter (hereinafter, referred to as "INT1") for inverting a first output signal outputted from the NMOS transistor and then outputting the inverted first output signal to the SR flip flop 510.

The first electric source 502 sets turn-off time of the PMOS transistor, and the second electric source 504 sets turn-off time of the NMOS transistor.

The inverting part 520 includes a second inverter (INT2) for inverting a second output signal outputted from the PMOS transistor, a third inverter (INT3) for inverting the inverted second output signal and then outputting the re-inverted second output signal to the SR flip flop, a fourth inverter (INT4) for inverting the first output signal outputted from the NMOS transistor, a fifth inverter (INT5) for inverting the inverted first output signal and then outputting the re-inverted first output signal to the first inverter (INT1).

Figures 7A, 7B:
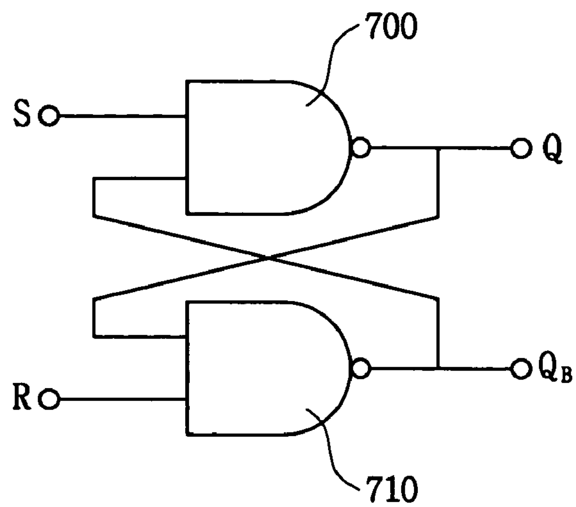
FIG. 7A shows an SR flip flop of the loop filter selector of FIG. 5.
FIG. 7B is an operating characteristic table of the SR flip flop of FIG. 7A.

FIG. 7A is a plan view illustrating the architecture of the SR flip flop of the loop filter selector of FIG. 5, and FIG. 7B is a characteristic table of the SR flip flop of FIG. 7A.

As shown in FIG. 7A, the SR flip flop 510 is a NAND-based SR flip flop including two NAND gates 700, 710. The characteristic table of the SR flip flop 510 is shown in FIG. 7B. In other words, when 1 is inputted to a first and second input terminals S, R of the SR flip flop, a first and second output terminals Q, $Q_b$ output a prior signal and when 0 is inputted, 1 is outputted. On the other hand, 0 and 1 are alternatively inputted to the first and second input terminals S, R. As a result, the first and second output terminals Q, $Q_b$ output 1 and 0, respectively. When 1 and 0 are alternatively inputted to the first and second input terminals S, R, the first and the second output terminals Q, $Q_b$ output 0 and 1, respectively.

Figure 8:
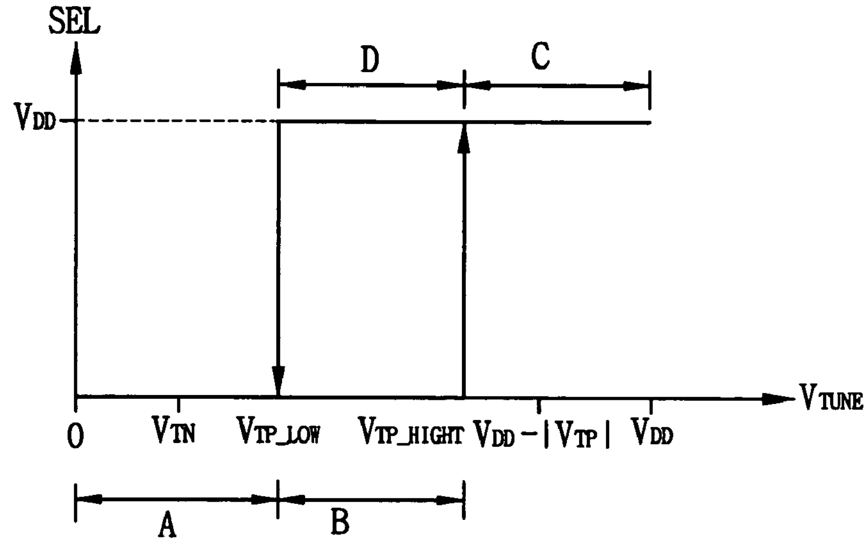
FIG. 8 shows an input/output voltage transmission/receipt characteristic of the loop filter selector.

Operation of the loop filter selector 450 is described by referring to FIG. 8.

FIG. 8 is a plan view illustrating an input/output voltage transmission/receipt characteristic of the loop filter selector.

As shown in FIG. 8, the inverter type comparator 500 of the loop filter selector 450 sets the first to fourth sensing sections (A, B, C, D) in accordance with the level of the tuning voltage ($V_{tune}$).

The tuning voltage ($V_{tune}$) corresponding to the first sensing section (A) is in the range of 0 to a first transition point voltage ($V_{tp-low}$). The tuning voltage ($V_{tune}$) corresponding to the second sensing section (B) is in the range of the first transition point voltage ($V_{tp-low}$) to a second transition point voltage ($V_{tp-high}$). The tuning voltage ($V_{tune}$) corresponding to the third sensing section (C) is preferably greater than the second transition point voltage ($V_{tp-high}$), and more preferably in the range of the second transition point voltage ($V_{tp-high}$) to the bias voltage of the PMOS capacitor ($V_{dd}$). The tuning voltage ($V_{tune}$) corresponding to the fourth sensing section (D) is in the range of the first transition point voltage ($V_{tp-low}$) to the second transition point voltage ($V_{tp-high}$). Here, the second transition point voltage ($V_{tp-high}$) is higher than the first transition point voltage ($V_{tp-low}$).

The first transition point voltage ($V_{tp-low}$) is set by the second electric source 504. Whereas, the second transition point voltage ($V_{tp-high}$) is set by the first electric source 502.

Equations defining the first transition point voltage ($V_{tp-low}$) and the second transition point voltage ($V_{tp-high}$) are as the following equation 1 and equation 2.

$$V_{tp-low} = \sqrt{\frac{2 \times I_{tp-low}}{\mu_n \times C_{ox} \times \left(\frac{W_n}{L_n}\right)}} + |V_{TN}| \quad \text{[Equation 1]}$$

$$V_{tp-high} = \sqrt{\frac{2 \times I_{tp-high}}{\mu_p \times C_{ox} \times \left(\frac{W_p}{L_p}\right)}} + |V_{TP}| \quad \text{[Equation 2]}$$

where, $I_{tp-low}$ is the first electric source 502, $I_{tp-high}$ is the second electric source 504, $\mu_n$ is a mobility factor of the NMOS transistor, and $\mu_p$ is a mobility factor of the PMOS transistor. In addition, $C_{ox}$ is a capacitance of a gate of the transistor in unit area. $W_n$ and $L_n$ are the channel width and the channel length of the NMOS transistor, respectively. Alternatively, $W_p$ and $L_p$ are the channel width and the channel length of the PMOS transistor. $V_{TN}$ is the threshold voltage of the NMOS transistor. Whereas, $V_{TP}$ is the threshold voltage of the PMOS transistor.

As shown in the equation 1 and the equation 2, the first transition point voltage ($V_{tp-low}$) is higher than the threshold voltage ($V_{TN}$) of the NMOS capacitor. The second transition point voltage ($V_{tp-high}$) is lower than the turn-off voltage ($V_{DD}-|V_{TP}|$) of the PMOS capacitor. The PMOS transistor (PM) of the inverter type comparator 500 is turned on in the first sensing section (A), and maintains turn-on condition in the second sensing section (B).

The NMOS transistor (NM) of the inverter type comparator 500 is turned on in the third sensing section (C), and maintains turn-on condition in the fourth sensing section (D).

Because the PMOS transistor (PM) is turned on and the NMOS transistor (NM) is turned off in the first sensing section (A), 1 is inputted into the first input terminal (S) of the SR flip flop 510, and 0 is inputted into the second input terminal (R) of the SR flip flop 510. As a result, the first output terminal and the second output terminal Q, $Q_b$ of the SR flip flop 510 output 0 and 1, respectively. In other words, the SR flip flop 510 outputs the first selection signal ($\overline{\text{sel}}$ 1) having low logic.

Because the PMOS transistor (PM) is turned off and the NMOS transistor (NM) is turned on in the third sensing section (C), 0 is inputted into the first input terminal (S) of the SR flip flop 510, and 1 is inputted into the second input terminal (R) of the SR flip flop 510. As a result, the first and second output terminals Q, $Q_b$ of the SR flip flop 510 output 1 and 0, respectively. In other words, the SR flip flop outputs the third selection signal (sel 3) having high logic.

In addition, the PMOS transistor (PM) and the NMOS transistor (NM) are turned on in the second sensing section (B). Therefore, 1 and 1 are inputted into the first and second input terminals (S, R) of the SR flip flop 510, respectively. The second sensing section (B) is a section following the first sensing section (A). As a result, the first and second output terminals Q, $Q_b$ output the second selection signal having the same logic that the first selection signal has. Therefore, 0 and 1 are outputted from the first and second output terminals Q, $Q_b$ of the SR flip flop 510, respectively. In other words, the SR flip flop 510 outputs the second selection signal ($\overline{\text{sel}}$ 2) having low logic in the second sensing section (B).

On the other hand, the PMOS transistor (PM) and the NMOS transistor (NM) are turned on in the fourth sensing section (D). Therefore, 1 and 1 are inputted into the first and second input terminals (S, R) of the SR flip flop 510, respectively. The fourth sensing section (D) is a section following the third sensing section (C). As a result, the first and second output terminals Q, $Q_b$ output the fourth selection signal having the same logic that the third selection signal has. Therefore, 1 and 0 is outputted from the first and second output terminals Q, $Q_b$ of the SR flip flop 510, respectively. In other words, the SR flip flop 510 outputs the fourth selection signal ($\overline{\text{sel}}$ 4) having high logic.

As described above, the loop filter selector 450 respectively outputs the first and second selection signals having low logic in the first and second sensing sections (A, B). Whereas, the loop filter selector 450 alternatively outputs the third and fourth selection signals in the third and fourth sensing sections (C, D).

As shown in FIG. 6, the loop filter 440 includes a first loop filtering part 600, a second loop filtering part 610, a first switch (S1) and a second switch (S2).

The first loop filtering part 600 includes a first PMOS capacitor 602 and a second PMOS capacitor 604 coupled in parallel, and a first resistor (R1) coupled to a gate of the first PMOS capacitor 602.

The second loop filtering part 610 includes a first NMOS capacitor 612 and a second NMOS capacitor 614 coupled in parallel, and a second resistor (R2) coupled to a gate of the NMOS capacitor 612.

The first switch (S1) is switched on by the first and second selection signals having low logic, thereby allowing the first loop filtering part 600 to operate. As a result, the first loop filtering part 600 integrates current corresponding to a charge-pumping signal outputted from the charge pump 430, and outputs the tuning voltage ($V_{tune}$) to the VCO 400 in accordance with the integration.

The second switch (S2) is switched by the third and fourth selection signals having high logic, thereby allowing the second loop filtering part 610 to operate. As a result, the second loop filtering part 610 integrates the current corresponding to the charge-pumping signal outputted from the charge pump 430, and outputs the tuning voltage ($V_{tune}$) to the VCO 400 in accordance with the integration.

Figure 9:
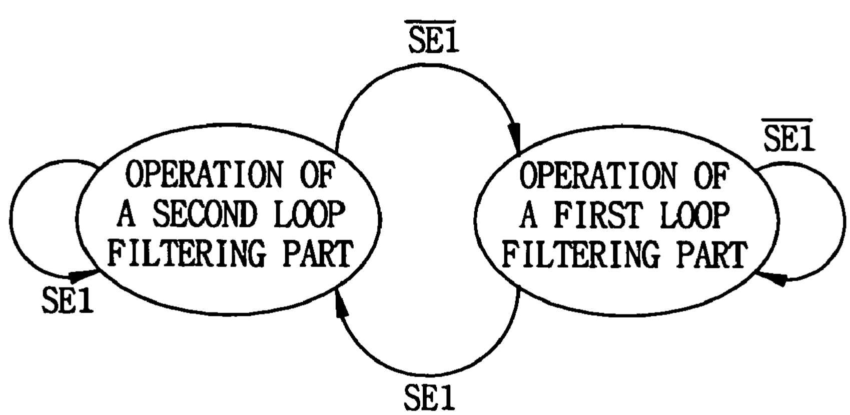
FIG. 9 is a state diagram illustrating the operation of the loop filter according to one embodiment of the invention.

FIG. 9 is a state diagram illustrating operation of the loop filter according to one embodiment of the invention.

Referring to FIG. 9, the first to fourth selection signals are outputted from the loop filter selector 450 in accordance with the change of the tuning voltage ($V_{tune}$). The first loop filtering part 600 and the second loop filtering part 620 are selectively operated in accordance with the first to fourth selection signals.

In other words, the first loop filtering part 600 operates in the first sensing section (A). The first loop filtering part 600 includes the first and second PMOS capacitors 602, 604. The NMOS capacitors are not operated in the first sensing section (A). On the other hand, the second loop filtering part 610 operates in the third sensing section (C). The second loop filtering part 610 includes the first and second NMOS capacitors 612, 614. The PMOS capacitors are not operated in the third sensing section (C).

The NMOS capacitors and the PMOS capacitors are operated in the second and fourth sensing sections (B, D). However, in the second sensing section (B), the first loop filtering part 600 is operated, and the second loop filtering part 610 is not operated. Whereas, in the fourth sensing section (D), the first loop filtering part 600 is not operated and the second loop filtering part 610 is operated.

Figure 10:
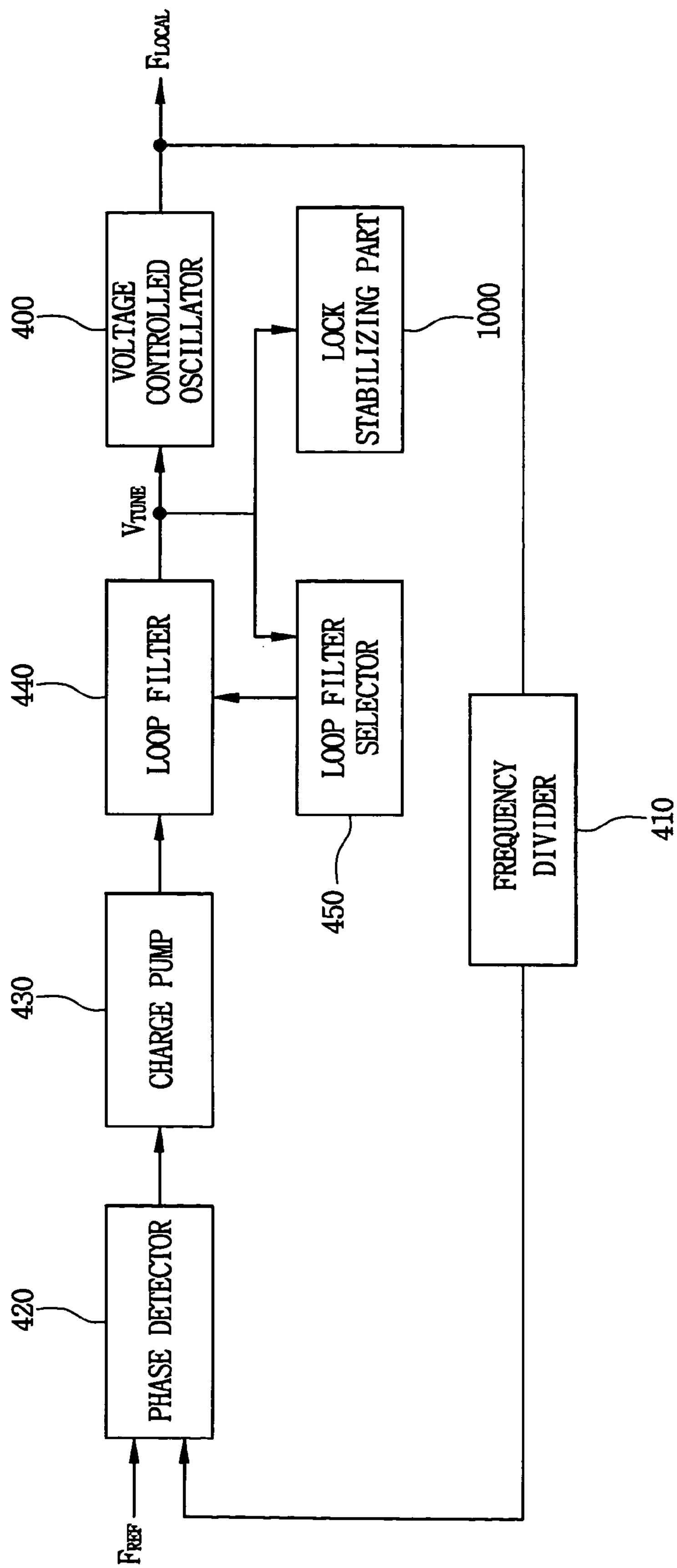
FIG. 10 is a block diagram of a PLL circuit according to another embodiment of the invention.
Figure 11:
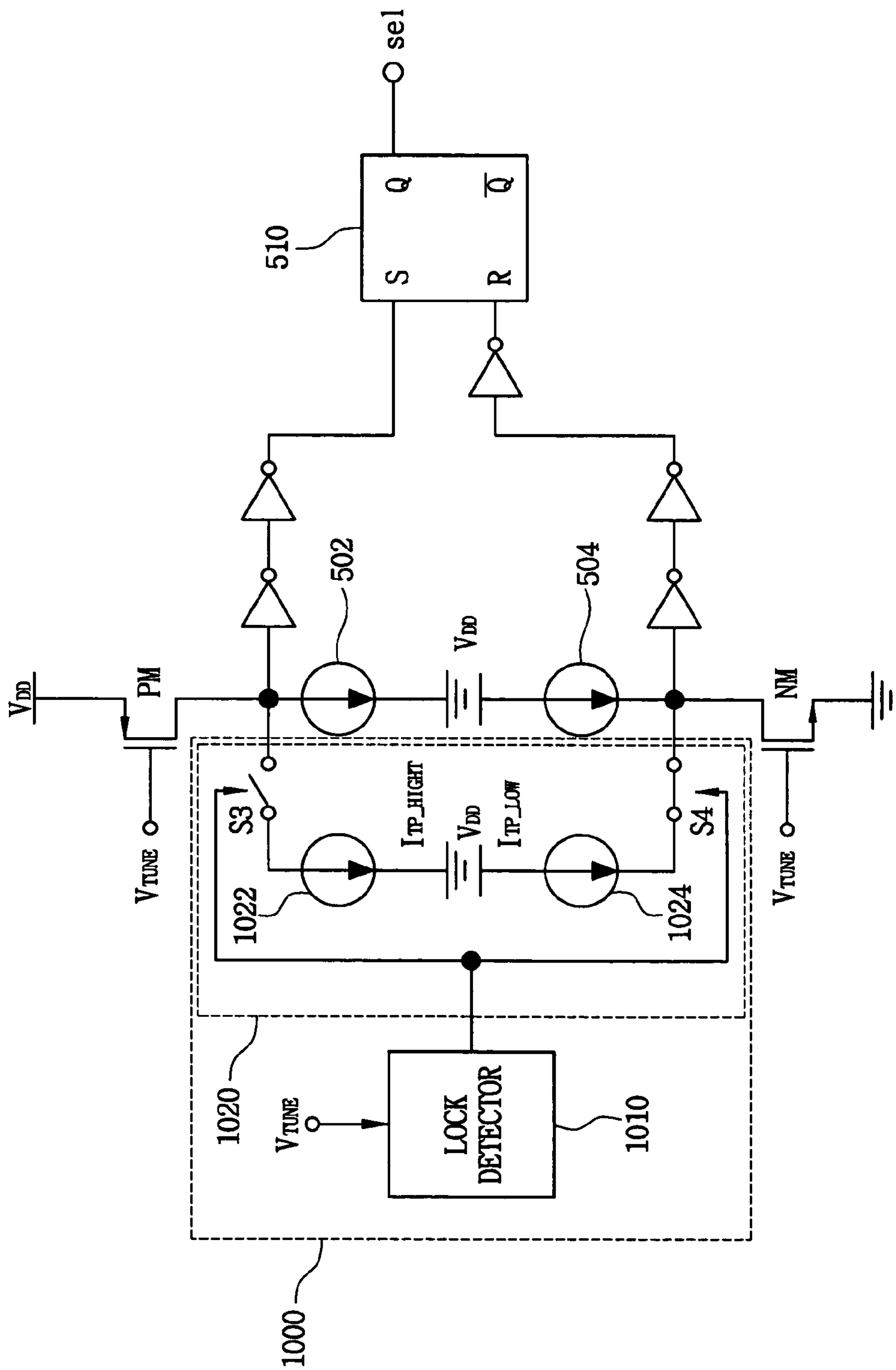
FIG. 11 illustrates a circuit of a loop filter selector and a lock stabilizing part in the FIG. 10.

FIG. 10 is a block diagram illustrating architecture of a PLL circuit according to another embodiment of the invention, and FIG. 11 is a detailed plan view illustrating a circuit of a loop filter selector and a lock stabilizing part in FIG. 10.

Referring to FIG. 10, the PLL circuit according to one embodiment of the invention includes the lock stabilizing part 1000 for safe operation of the PLL. Referring now in specific detail to the drawings in which like reference numerals identify similar or identical elements throughout the several views, and thus any further detailed descriptions concerning the same elements will be omitted.

As shown in FIG. 11, the lock stabilizing part 1000 includes a lock detector 1010 and a voltage changing part 1020. The lock detector 1010 detects whether or not the PLL circuit is locked, and outputs a lock detection signal corresponding to a digital signal in accordance with the detection. The voltage changing part 1020 changes the first transition point voltage ($V_{tp-low}$) and the second transition point voltage ($V_{tp-high}$) in accordance with the lock detection signal outputted from the lock detector 1010. The first transition point voltage ($V_{tp-low}$) is a voltage of a point of time that the NMOS transistor (NM) of the loop filter selector 450 is turned off. The second transition point voltage ($V_{tp-high}$) is a voltage of a point of time that the PMOS transistor of the loop filter selector 450 is turned off.

The voltage changing part 1020 includes a third electric source 1022 coupled in parallel to the first electric source 502, a fourth electric source 1024 coupled in parallel to the second electric source 504, a third switch (S3) and a fourth switch (S4). The third switch (S3) allows the third electric source 1022 to couple selectively to the first electric source 502. The fourth switch (S4) allows the fourth electric source 1024 to couple selectively to the second electric source 504. In initial condition, the third switch (S3) is off, and the fourth switch (S4) is on.

The lock detector 1010 of the lock stabilizing part 1000 receives the tuning voltage ($V_{tune}$), and detects a point of time that the tuning voltage ($V_{tune}$) is maintained constantly. In other words, the lock detector 1010 detects whether the local signal is divided by the frequency divider 410 and whether the reference signal ($f_{ref}$) is identical in view of phase or frequency. After all, the lock detector 1010 detects whether or not the PLL circuit is locked.

In the case that the PLL circuit is locked when the tuning voltage ($V_{tune}$) is near the first transition point voltage ($V_{tp-low}$) or the second transition point voltage ($V_{tp-high}$), the NMOS transistor (NM) or the PMOS transistor (PM) of the loop filter selector 450 may be turned on or turned off. Thus, operation of the loop filter 440 may be changed. As a result, the PLL circuit may be unlocked. Therefore, the PLL circuit needs to be again locked.

The voltage changing part 1020 prevents the PLL circuit from being again locked. The third switch S3 of the voltage changing part 1020 is turned on when the lock detection signal is provided from the lock detector 1010. The third electric source 1022 is coupled in parallel to the first electric source 502 according to the third switch S3 being turned on.

Current passing through the PMOS transistor (PM) of the loop filter selector 450 is augmented according to the third electric source 1022 being coupled in parallel to the first electric source 502. Therefore, the second transition point voltage ($V_{tp-high}$) is augmented.

The fourth switch S4 of the voltage changing part 1020 is turned off when the lock detection signal is provided from the lock detector 1010. Coupled with the fourth electric source 1024, the second electric source 504 is released according to the fourth switch S4 being turned off.

Current passing through the NMOS transistor (NM) is reduced according to the coupling of the fourth electric source 1024 and the second electric source 504 being released. Therefore, the first transition point voltage ($V_{tp-low}$) is reduced.

Figure 12:
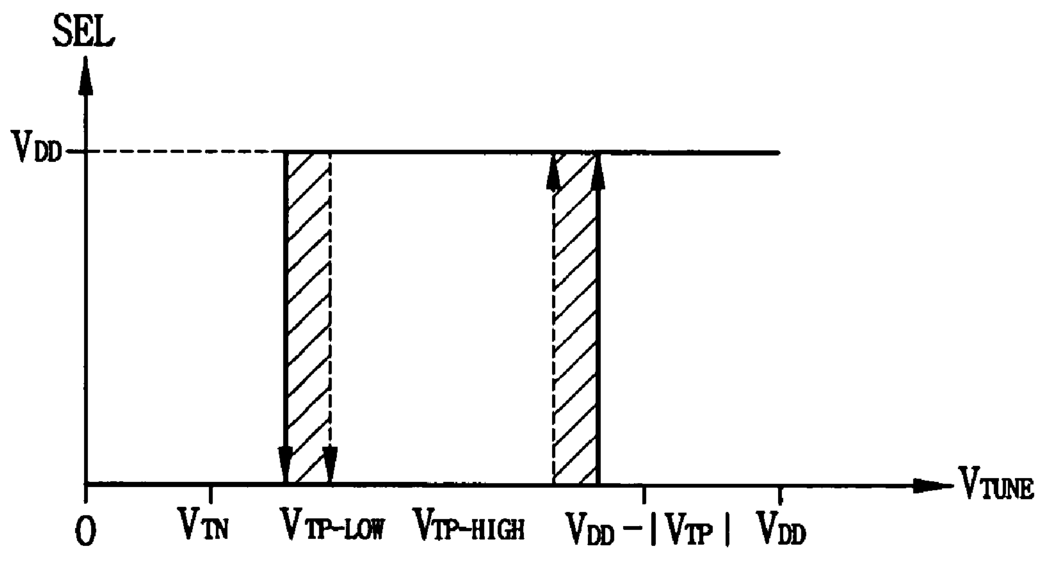
FIG. 12 illustrates the input/output voltage characteristics of the loop filter selector according to an embodiment of the invention.

FIG. 12 is a plan view illustrating input/output voltage characteristic of the loop filter selector according to one embodiment of the invention.

As shown in FIG. 12, the first transition point voltage ($V_{tp-low}$) is reduced, and the second transition point voltage ($V_{tp-high}$) is augmented. As a result, operation of the loop filter 440 is not changed when the tuning voltage ($V_{tune}$) is near the first transition point voltage ($V_{tp-low}$) or the second transition point voltage ($V_{tp-high}$).

While the invention has been particularly shown and described with reference to preferred embodiments thereof, it is noted that modifications and variations can be made by persons skilled in the art in light of the above teachings. For example, the section selection loop filter has four sensing sections and four corresponding selection signals. However, a section loop filter can have different numbers, such as 2, 8, or 12, of sensing sections and corresponding selection signals. It is therefore to be understood that changes may be made in the particular embodiment of the present invention disclosed which is within the scope and spirit of the invention outlined by the appended claims.

What is claimed is:

1. A section selection loon filter, comprising:

selection signal outputting part for setting a plurality of sensing sections according to an input tuning voltage, selecting a plurality of selection signals corresponding to the plurality of sensing sections respectively, and outputting the plurality of selection signals to a filtering part thereof;

the filtering part for receiving and filtering a charge-pumping signal from a charge pump based on the plurality of selection signals;

wherein the plurality of sensing sections include first to fourth sensing sections and the plurality of selection signals include first to fourth selection signals corresponding to the first to fourth sensing sections respectively.

2. The section loop filter of claim 1, wherein the filtering part includes:

a first filtering part for generating a first tuning signal and a second tuning signal having a first logic using the received charge-pumping signal; and a second filtering part for generating a third tuning signal and a fourth tuning signal having a second logic using the received charge-pumping signal, wherein the second logic is opposed to the first logic.

3. The section selection loop filter of claim 1, wherein the selection signal outputting part includes:

a condition sensing part having a first transistor that is turned on during the first sensing section and the second sensing section and turned off during the fourth sensing section; and a second transistor that is turned on during the third sensing section and the fourth sensing section and turned off during the second sensing section;

an outputting part for outputting the first selection signal, the second selection signal, the third selection signal and the fourth selection signal.

4. The section selection loop filter of claim 3, further includes:

a first electric source for setting a turn-off time of the first transistor, wherein the first electric source is coupled to the first transistor;

a second electric source for setting a turn-off time of the second transistor, wherein the second electric source is coupled to the second transistor; and an inverter for inverting an output signal outputted from the second transistor.

5. The section selection loop filter of claim 3, wherein the condition sensing part sets the first to fourth sensing sections in accordance with the level of a tuning voltage outputted from the filtering part, the tuning voltage corresponding to the first sensing section is in the range of 0 to a first transition point voltage, the tuning voltage corresponding to the second sensing section is in the range of the first transition point voltage to a second transition point voltage, the tuning voltage corresponding to the third sensing section is greater than the second transition point voltage, and the tuning voltage corresponding to the fourth sensing section is in the range of the first transition point voltage to the second transition point voltage, and the second transition point voltage is higher than the first transition point voltage.

6. The section selection loop filter of claim 5, wherein the first transition point voltage is higher than a threshold voltage of the second transistor, and the second transition point voltage is lower than a turn-off voltage of the first transistor.

7. A section selection loon filter, comprising:

a selection signal outputting part for setting a plurality of sensing sections according to an input tuning voltage, selecting a plurality of selection signals corresponding to the plurality of sensing sections respectively, and outputting the plurality of selection signals to a filtering part thereof;

the filtering part for receiving and filtering a charge-pumping signal from a charge pump based on the plurality of selection signals;

wherein the outputting part includes an SR flip flop.

8. The section selection loop filter of claim 2, wherein the first filtering part includes:

a first PMOS capacitor;

a second PMOS capacitor coupled in parallel to the first PMOS capacitor;

a first resistor coupled to the first PMOS capacitor; and a first switch coupled to the first and second PMOS capacitors.

9. The section selection loop filter of claim 2, wherein the second filtering part includes:

a first NMOS capacitor;

a second NMOS capacitor coupled in parallel to the first NMOS capacitor;

a second resistor coupled to the first NMOS capacitor; and a second switch coupled to the first and second NMOS capacitors.

10. A phase locked loop circuit comprising:

a voltage controlled oscillator for outputting a local frequency signal corresponding to a tuning voltage inputted from a loop filter thereof;

a phase detector for comparing a reference signal with the local frequency signal outputted from a frequency divider connected to the voltage controlled oscillator, generating a pulse signal corresponding to the difference between the local frequency signal and the reference signal in view of phase, and outputting the pulse signal to a charge pump; a loop filter selector for setting a plurality of sensing sections according to the tuning voltage inputted from the loop filter, selecting a plurality of selection signals corresponding to the plurality of sensing sections respectively, and outputting the plurality of selection signals to the loop filter; and the loop filter for receiving and filtering the charge-pumping signals from the charge pump and outputting a plurality of tuning signals corresponding to the plurality of selection signals using the pulse signal to the voltage controlled oscillator;

wherein the plurality of sensing sections include first to fourth sensing sections, the plurality of selection signals include first to fourth selection signals corresponding to the first to fourth sensing sections respectively, and the plurality of tuning signals includes a first to fourth tuning signals.

11. The phase locked loop circuit of claim 10, wherein the loop filter includes:

a first loop filtering part for generating a first tuning signal and a second tuning signal having a first logic using the received charge pumping signal; and a second loop filtering part for generating a third tuning signal and a fourth tuning signal having a second logic using the received charge-pumping signal, wherein the second logic is opposed to the first logic.

12. The phase locked loop circuit of claim 10, wherein the loop filter selector includes:

a condition sensing part having a first transistor that is turned on during the first sensing section and the second sensing section and turned off during the fourth sensing section and a second transistor that is turned on during the third sensing section and the fourth sensing sections and turned off during the second sensing section;

an outputting part for outputting the first selection signal, the second selection signal, the third selection signal and the fourth selection signal.

13. The phase locked loop circuit of claim 12, wherein the loop filter selector further includes:

a first electric source for setting a turn-off time of the first transistor, wherein the first electric source is coupled to the first transistor;

a second electric source for setting a turn-off time of the second transistor, wherein the second electric source is coupled to the second transistor;

an inverter for inverting an output signal outputted from the second transistor; and an SR flip flop for selectively outputting the plurality of selection signals according to the operation of the first transistor and the second transistor corresponding to the plurality of sensing sections.

14. The phase locked loop circuit of claim 12, wherein the condition sensing part sets the first to fourth sensing sections in accordance with the level of the tuning voltage outputted from the loop filter, the tuning voltage corresponding to the first sensing section is in the range of 0 to a first transition point voltage;

the tuning voltage corresponding to the second sensing section is in the range of the first transition point voltage to a second transition point voltage;

the tuning voltage corresponding to the third sensing section is greater than the second transition point voltage;

the tuning voltage corresponding to the fourth sensing section is in the range of the first transition point voltage to the second transition point voltage; and the second transition point voltage is higher than the first transition point voltage.

15. The phase locked loop circuit according to claim 12, wherein the first transition point voltage is higher than a threshold voltage of the second transistor, and the second transition point voltage is lower than a turn-off voltage of the first transistor.

16. A phase locked loop circuit comprising:

a voltage controlled oscillator for outputting a local frequency signal corresponding to a tuning voltage inputted from a loop filter thereof;

a phase detector for comparing a reference signal with the local frequency signal outputted from a frequency divider connected to the voltage controlled oscillator, generating a pulse signal corresponding to the difference between the local frequency signal and the reference signal in view of phase, and outputting the pulse signal to a charge pump; a loop filter selector for setting a plurality of sensing sections according to the tuning voltage inputted from the loop filter, selecting a plurality of selection signals corresponding to the plurality of sensing sections respectively, and outputting the plurality of selection signals to the loop filter; and the loop filter for receiving and filtering the charge-pumping signals from the charge pump and outputting a plurality of tuning signals corresponding to the plurality of selection signals using the pulse signal to the voltage controlled oscillator;

further comprising a lock stabilizing part for preventing the frequency signal from synchronizing with the reference signal when the tuning voltage is near one of a first transition point voltage and a second transition voltage.

17. The phase locked loop circuit of claim 16, wherein the lock stabilizing part includes:

a lock detector for detecting whether or not the frequency signal synchronizes with the reference signal and generating a lock detection signal in accordance with the detection; and a voltage changing part for decreasing the first transition point voltage and increasing the second transition point voltage in accordance with the lock detection signal.

18. The phase locked loop circuit of claim 17, wherein the voltage changing part includes:

a first switch that is turned on in accordance with the lock detection signal and turned off in an initial condition;

a second switch that is turned off in accordance with the lock detection signal and turned on in an initial condition;

a third electric source coupled to the first switch, wherein a third switch allows the third electric source to couple selectively to the first electric source coupled to a first transistor; and a fourth electric source coupled to the second switch, wherein a fourth switch allows the fourth electric source to couple selectively to a second electric source coupled to a second transistor.

19. The phase locked loop circuit of claim 11, wherein the loop filter includes:

the first loop filtering part turned on in accordance with the first selection signal, keeping the turned-on condition thereof in accordance with the second selection signal; and the second loop filtering part turned-on in accordance with the third selection signal, keeping the turned-on condition thereof in accordance with the fourth selection signal.

20. The phase locked loop circuit of claim 11, wherein the first loop filtering part includes:

a first PMOS capacitor;

a second PMOS capacitor coupled in parallel to the first PMOS capacitor;

a first resistor coupled to the first PMOS capacitor; and a first switch coupled to the first PMOS capacitor and the second PMOS capacitor.

21. The phase locked loop circuit of claim 11, wherein the second loop filtering part includes:

a first NMOS capacitor;

a second NMOS capacitor coupled in parallel to the first NMOS capacitor;

a second resistor coupled to the first NMOS capacitor; and a second switch coupled to the first NMOS capacitor and the second NMOS capacitor.

22. An output full swing type low pass filter comprising:

a resistor coupled between an input terminal and an output terminal;

a PMOS capacitor coupled between a first electric source voltage and the output terminal;

an NMOS capacitor coupled between a second electric source voltage and the output terminal;

a first switching means coupled to the PMOS capacitor;

a second switching means coupled to the NMOS capacitor; and a selection means for turning-on the second switching means in a first sensing section and turning-on the first switching means in a second sensing section, thereby coupling selectively the PMOS capacitor and the NMOS capacitor, wherein a voltage of the output terminal corresponding to the first sensing section is in the range of the second electric source voltage to a first transition point voltage and the voltage of the output terminal corresponding to the second sensing section is in the range of the first electric source voltage to a second transition point voltage.

23. The output full swing type low pass filter of claim 22, wherein the first transition point voltage is a voltage of a point of time that the PMOS capacitor is turned off, and the second transition point voltage is a voltage of a point of time that the NMOS capacitor is turned off.

* * * * *